US006885539B1

(12) United States Patent
Devoe et al.

(10) Patent No.: US 6,885,539 B1
(45) Date of Patent: *Apr. 26, 2005

(54) SINGLE LAYER CAPACITOR

(75) Inventors: Alan Devoe, La Jolla, CA (US); Lambert Devoe, San Diego, CA (US); Hung Trinh, San Diego, CA (US)

(73) Assignee: Presidio Components, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/725,625

(22) Filed: Dec. 2, 2003

(51) Int. Cl.[7] ................. H01G 4/005; H01G 4/228; H01G 4/06

(52) U.S. Cl. ............... 361/303; 361/306.1; 361/311

(58) Field of Search ................. 361/301.1, 301.3, 361/301.4, 303–305, 306.1, 306.2, 306.3, 307, 308.1, 308.2, 308.3, 309, 310–313, 320, 765–766

(56) References Cited

U.S. PATENT DOCUMENTS

| | | | |
|---|---|---|---|
| 4,439,813 A | 3/1984 | Dougherty et al. | 361/321 |
| 4,819,128 A | 4/1989 | Florian et al. | 361/321 |
| 4,864,465 A | 9/1989 | Robbins | 361/320 |
| 4,881,308 A | 11/1989 | McLaughlin et al. | 29/25.42 |
| 5,177,663 A | 1/1993 | Ingleson et al. | 361/321 |
| 5,220,483 A | 6/1993 | Scott | 361/313 |
| 5,353,498 A | 10/1994 | Fillion et al. | 29/840 |
| 5,576,926 A | 11/1996 | Monsorno | 361/303 |
| 5,590,016 A | 12/1996 | Fujishiro et al. | 361/313 |
| 5,599,414 A | 2/1997 | Roethlingshoefer et al. | 156/89 |
| 5,712,758 A | 1/1998 | Amano et al. | 361/321.2 |
| 5,757,611 A | 5/1998 | Gurovich et al. | 361/321.4 |
| 5,855,995 A | 1/1999 | Haq et al. | 428/210 |
| 6,088,215 A | 7/2000 | Webb et al. | 361/306.3 |
| 6,208,501 B1 | 3/2001 | Ingalls et al. | 361/303 |

OTHER PUBLICATIONS

American Technical Ceramics, *ATC Millimeter Wavelength Single Layer Capacitors*, Brochure, 3 pp., Revised Feb. 1998.

Compex Corp, *MICROWAVE Chip Capacitors*, Brochure, 3 pp. publication (date unknown).

*Primary Examiner*—Eric Thomas
(74) *Attorney, Agent, or Firm*—Wood, Herron & Evans, LLP

(57) ABSTRACT

A monolithic or essentially monolithic single layer capacitor with high structural strength and capacitance, a printed circuit board having the capacitor mounted thereon, and a method of making. Sheets of green-state ceramic dielectric material and glass/metal composite material are laminated together, diced into individual chips, and fired to sinter the glass and the ceramic together. The composite material contains an amount of metal sufficient to render the composite conductive whereby the composite may be used for one or both electrodes and for mounting the capacitor to the printed circuit board. Vertically-oriented surface mountable capacitors and hybrid capacitors are provided.

51 Claims, 3 Drawing Sheets

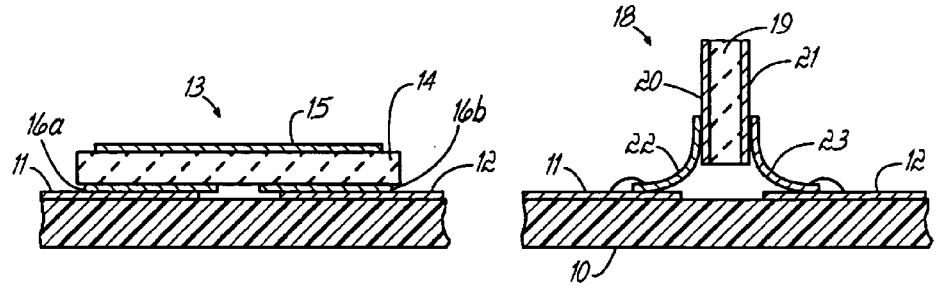
PRIOR ART
FIG. 1
PRIOR ART
FIG. 2
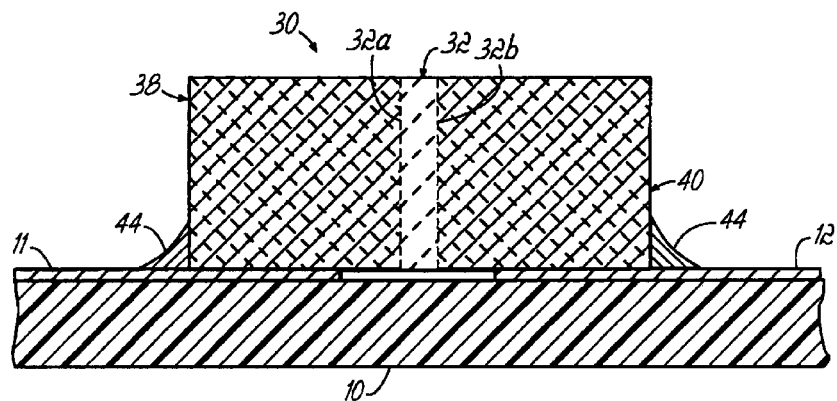
FIG. 3A
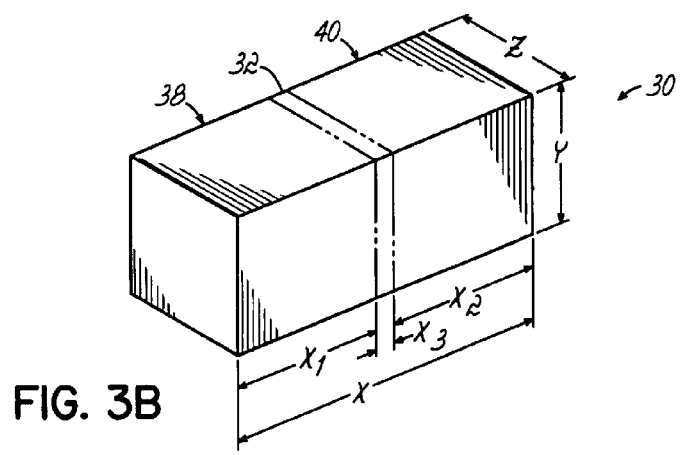
FIG. 3B

SINGLE LAYER CAPACITOR

CROSS-REFERENCE TO RELATED APPLICATIONS

This application is related to commonly owned application Ser. Nos. 10/188,696 filed Jul. 2, 2002, now U.S. Pat. No. 6,661,639 and Ser. No. 10/694,125 filed Oct. 27, 2003 now U.S. Pat. No. 6,822,847, the disclosures of which are incorporated herein by reference in their entirety as if completely set forth herein below.

FIELD OF THE INVENTION

This invention relates to single layer capacitors, and in particular, surface mountable single layer capacitors, printed circuit boards including the single layer capacitor mounted thereon, and methods of making the capacitors and the printed circuit boards.

BACKGROUND OF THE INVENTION

The "parallel plate" or "single layer" ceramic capacitor has a very useful form factor for assembly into microwave frequency and similar electrical circuits. These circuits may be laid out on printed circuit (pc) boards, or be present on integrated circuits (ICs) within chip carriers and other packages where space is typically even more precious. The dimensions of the ceramic capacitor can be matched to the width of a strip line on the pc board or the chip carrier holding an IC.

In assembly, the bottom face of the ceramic chip capacitor is typically soldered to or conductive epoxy attached to the surface of the pc board substrate. The top face of the ceramic capacitor normally presents one or more electrically conductive pads that are typically ribbon- or wire-bonded to another circuit connection point.

Most ceramic chip capacitors currently offered are made by metallizing two faces of a thin sheet of sintered ceramic that is typically in the range of 4 mils to 10 mils thick. The metallized ceramic sheet is then cut to size by sawing or abrasive cutting techniques. Typical sizes of the chip capacitors range from 10 mils square to 50 mils (0.01 to 0.05 inches) square, although some applications use rectangular forms.

While the form factor of these simple devices—used in quantities of hundreds of millions per year—is highly desirable, the amount of capacitance that can be achieved and quality of the devices realizing maximum capacitance is starting to limit their usefulness in certain applications. The simplified equation for the capacitance of a parallel plate capacitor, $c=KA/d$ where K is the dielectric constant, A the area of each of opposed plates, and d the distance of separation between plates, shows that a 20 mils square part (A) of 5 mils thickness (d) made from ceramic with a relative dielectric constant of 100 yields a capacitance of 8 picofarads.

This five mils thickness—necessitated in order to establish some structural strength for the given area size of, for example, 20 mils×20 mils—means that the capacitor does not have much structural strength, and is subject to undesirable fracturing or chipping during routine handling and assembly into circuits. Thus, the physical resistance to damage of the highest-capacitance "parallel plate" or "single layer" ceramic capacitors is inherently poor. The design of single layer capacitors in general is a compromise between the use of thicker ceramic layers for greater strength and thinner ceramic layers for greater capacitance.

In addition to the difficulties in achieving high capacitance while maintaining structural strength, due to the small size of the capacitors, they are difficult to attach automatically to a pc board. One approach has been to use a flat, horizontal capacitor with the metallization on its lower side having a gap. A device of this type is referred to as the GAP-CAP™ manufactured by Dielectric Laboratories, Inc. A GAP-CAP™ device is shown in FIG. 1, mounted onto a pc board 10 in which metal traces 11 and 12 constitute a transmission line. The flat capacitor 13 is horizontally disposed to bridge the gap between the traces 11, 12. The capacitor 13 has a dielectric chip or slice 14 that is elongated in the horizontal direction, i.e., is horizontally-oriented, with a metallized upper surface 15 and metallized lower surface portions 16a and 16b, which are electrically joined to the traces 11 and 12, respectively. However, these devices can create unwanted resonances at frequencies above a few gigahertz. In addition, these capacitors are quite small, typically about 20–25 mils. At these sizes, the capacitors are difficult to handle, and must be installed using a microscope. The capacitor 13 has a definite top and bottom, and it is crucial to install them in the proper orientation, to avoid shorting the circuit. Thus, mounting of the capacitor is difficult and expensive. Also, the additional requirement of attaching metal leads to metallized upper surface 15 may further contribute to prohibitive manufacturing costs.

Another approach has been to use a standing dielectric chip with opposed metallized surfaces, and with metal leads attached to the respective surfaces. A prior art standing leaded capacitor 18 is shown in FIG. 2 installed on the traces 11, 12 of the pc board 10. The capacitor is formed of a vertically-oriented ceramic chip 19 with metallized front and back surfaces 20, 21. There are flat metal leads 22, 23 affixed onto the metallized surfaces 20, 21 and these are soldered onto the metal traces 11, 12, respectively. The capacitor 18 has to be held in place while the leads 22, 23 are soldered to their respective places. The leads 22, 23 are fragile, and require extreme care in fabrication, shipping, handling and soldering in place to the traces 11, 12. Thus, the capacitors 18 have to be installed manually under a microscope, and robotized or automated circuit fabrication is difficult or impossible to obtain. In addition, the standing leaded capacitor 18 produces significant signal resonances, especially for frequencies above a few gigahertz.

It is desirable to provide a single layer capacitor that is surface mountable, thereby eliminating the requirement for wire bonding, which may be prohibitively expensive, and/or that can utilize a thin dielectric layer without sacrificing structural strength. A surface mountable capacitor is described in U.S. Pat. No. 6,208,501, wherein metal or metal-coated ceramic end blocks are soldered to a vertically-oriented dielectric chip sandwiched there between, whereby the end blocks serve as leads for attaching to metallic surface traces on the pc board. While the standing axial-leaded surface mount capacitor described in that patent is an improvement over the prior devices, the end blocks, which are described as 20–25 mils square blocks, must be manually assembled with the dielectric chip, which is a slow, intricate and expensive process subject to inaccurate alignment of the various components and to joint disattachment between the components during shipping and handling. For example, the block and/or metallization may pull away from the dielectric layer, causing the capacitor to open during use whereupon the capacitance will drop dramatically. In addition, the device described in that patent has a 20–25 mils width to match the width of a typical printed circuit trace. More specifically, the device is manufactured, for example, with a 50×20×20 mils size. However, at 40 gigahertz, the required trace width on the pc board is 10 mils wide. So at 40 gigahertz, the optimal chip size is 20×10×10 mils. The smaller the chip size, the more difficult and expensive it will be to mechanically assemble the end blocks to the dielectric chip. Moreover, in practice, only a limited range of capacitance values maybe produced, thereby limiting the flexibility of the product to meet consumer demands.

There is thus a need to provide a surface mountable single layer ceramic capacitor that may be easily assembled and inexpensively manufactured, and that has high capacitance and good structural strength.

SUMMARY OF THE INVENTION

The present invention provides a monolithic or essentially monolithic single layer capacitor with good structural strength that may be easily and inexpensively manufactured, and which may utilize thin ceramic dielectric layers to provide high capacitance. To this end, sheets of green-state ceramic dielectric material and glass/metal composite material are laminated together, diced into individual chips, and fired to sinter the glass and ceramic together. The composite material consists essentially of glass and an amount of metal sufficient to render the composite conductive whereby the composite may be used for one or both electrodes and for mounting the capacitor to the pc board. By the present invention, a capacitor is provided having a vertically-oriented ceramic dielectric between conductive composite blocks to provide a surface mountable capacitor that is monolithic or essentially monolithic. By the present invention, a hybrid capacitor is also provided having a horizontally-oriented ceramic dielectric on a bottom conductive composite block mountable to the pc board, and either a second top conductive composite block or a top metallization on the ceramic dielectric for wire bonding to the pc board. By virtue of at least one conductive composite block mountable to the pc board, a thin ceramic dielectric may be used while maintaining high structural integrity for the capacitor.

Moreover, by assembling the portions of the capacitor in the green-state, and co-firing the assembly, a monolithic or essentially monolithic structure is formed having no preformed parts and containing no epoxy, glue, solder, or other attachment means within the capacitor body thus further providing high structural integrity for the capacitor and simplifying the manufacturing process while allowing for further miniaturization of capacitors. The green-state method further provides flexibility that allows for a broad range of capacitor values to be obtained as desired by the consumer.

The present invention further provides a pc board having a single layer capacitor of the present invention mounted directly thereon. In one embodiment, the thin dielectric is vertically oriented and both electrodes are mounted directly to a respective surface trace. In another embodiment, the thin dielectric is horizontally oriented and one electrode is mounted directly to a first surface trace and a second electrode is wire bonded to a second surface trace. A method is also provided for making the pc board, including mounting the capacitor of the present invention to surface traces.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIG. 1 is a cross-sectional view of a prior art flat capacitor mounted to a pc board.

FIG. 2 is a cross-sectional view of a prior art standing leaded capacitor mounted to a pc board.

FIG. 3A is a cross-sectional view of an embodiment of a surface mounted standing capacitor of the present invention having conductive composite end blocks, and a pc board having the capacitor mounted directly thereon.

FIG. 3B is a perspective view of the capacitor of FIG. 3A.

DETAILED DESCRIPTION

Figure 4A:
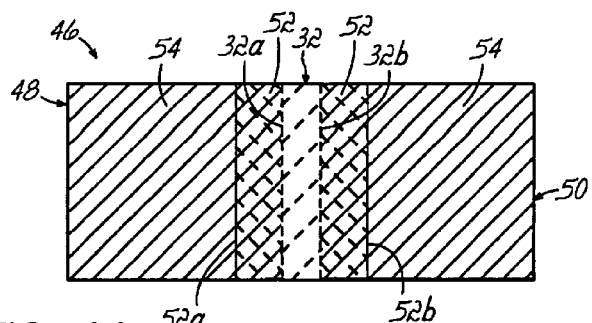
FIG. 4A is a cross-sectional view of another embodiment of a surface mountable standing capacitor of the present invention having conductive end blocks, a portion of which comprise a composite.

The present invention provides surface mountable single layer capacitors that may be easily assembled and inexpensively manufactured. The capacitors of the present invention utilize thin ceramic dielectric layers to provide high capacitance without sacrificing structural strength. The conductive composite blocks provide the structural strength and further serve as the electrodes, which are mountable on the metal surface traces on the pc board.

The capacitors of the present invention are manufactured starting in the green state. In one embodiment of the method of the present invention, a green-state ceramic dielectric sheet is placed between a pair of green-state composite metal/glass sheets. The metal content in the composite metal/glass sheets is sufficient to cause the composite to be conductive. The sheets are then laminated together, the laminate is diced into a plurality of individual chips, and the chips are fired to sinter the glass and ceramic materials, thereby forming a thin ceramic dielectric bonded between and supported by two composite blocks. Alternatively, the laminate may be first fired to sinter the glass and ceramic materials, and then diced into the plurality of individual chips. Because the composite blocks are conductive, plating with conductive metal or printing metallizations on the capacitor is unnecessary.

The two conductive composite blocks function as the capacitor electrodes and are mountable on the printed metal traces on a pc board. The capacitor may be mounted to provide a standing capacitor or to provide a hybrid flat capacitor, depending on the aspect ratios of the various layers. This embodiment eliminates the need to print metallizations on the ceramic dielectric layer, or on the exterior surfaces of the capacitor. The ceramic dielectric may be free of buried (internal) electrodes (metallizations) or may include one or more buried electrodes electrically connected to the conductive composite blocks by metal-filled vias. The resulting capacitor is a monolithic or an essentially monolithic structure, meaning that it is a solid or an essentially solid structure of materials that are sintered together, thereby eliminating boundaries/joints within the structure and the structure contains no epoxy, glue, solder or other attachment means between layers. The glass in the composite portions is sintered together with the center ceramic dielectric layer to essentially eliminate boundaries within the structure, thereby providing structural integrity. To state another way, monolithic is generally understood to refer to an object comprised entirely of one single piece (although polycrystalline or even heterogeneous) without joints or seams as opposed to being built up of preformed units. In the present invention, the only assembly occurs in the green state, and the individual capacitors obtained are sintered, monolithic or essentially monolithic structures. By "essentially" we refer to the optional presence of internal metallizations or buried electrodes in the ceramic that create a partial boundary or seam within the structure, but because the metallizations do not span the entire area of the ceramic dielectric layer, the ceramic materials sinter together around the metallizations to essentially form a monolithic structure. Thus, by monolithic, we refer to the absence of a complete or continuous boundary or seam within the specified structure, with no boundary at all being completely monolithic and a partial boundary being essentially monolithic. Where the layers sinter together, a bond region is formed, where one layer blurs into the other, but no clear boundary remains. The capacitors of the present invention are relatively easy to manufacture due to assembly occurring before dicing and firing the chips, which further allows for easy and accurate alignment of the components.

In another embodiment, only one conductive composite sheet is laminated to the ceramic dielectric sheet, and a metallization is provided on the opposing surface of the ceramic dielectric sheet. After firing the chip, the resulting capacitor may be mounted as a hybrid flat capacitor with the composite block on the bottom for bonding directly to the surface trace, and the metallization on the top for wire bonding to another surface trace. In this embodiment, the thin ceramic dielectric layer is bonded to and structurally supported by the bottom conductive composite block, which also functions as an electrode.

With reference to the drawings, in which like reference numerals are used to refer to like parts, FIG. 3A depicts in cross-sectional view a vertically-oriented, surface mounted, single layer capacitor 30 of the present invention. The standing or vertical capacitor 30 is provided having a vertically-oriented ceramic dielectric layer 32. Conductive metal/glass composite blocks 38, 40 are adjacent respective opposing vertical surfaces 32a, 32b. Due to capacitor 30 being cofired, the boundaries between conductive composite blocks 38, 40 and ceramic dielectric layer 32 are essentially eliminated or blurred, as indicated in phantom, by sintering together the glass and ceramic material, such that capacitor 30 is monolithic, as shown in perspective view in FIG. 3B. Thus, rather than a distinct boundary between the ceramic dielectric layer 32 and conductive composite blocks 38, 40, there is a bond region, indicated by the dashed lines, where glass and ceramic are sintered together and so the capacitor shifts from a center ceramic region (32) to outer predominantly metal regions (38 and 40). Capacitor 30 has four-way symmetry such that it may be positioned and soldered robotically without regard for orientation. In accordance with a method of the present invention, with the dielectric vertically oriented with respect to the pc board 10, conductive composite blocks 38, 40 are mounted, for example soldered using solder 44, directly to printed metal traces 11, 12 on a pc board 10, thereby providing axial leads for the capacitor 30.

In the embodiment depicted in FIGS. 3A and 3B, the end blocks 38, 40 comprise a composite metal/glass material in which particles of glass are dispersed in a conductive metal matrix. The conductive metal may be in the form of a powder or flakes, for example, and the glass is advantageously a glass frit. The powder or flakes are mixed with the glass frit, and the mixture is formed into a green-state tape or sheet, which may subsequently be assembled with the ceramic dielectric layer, diced, and hardened by cofiring the structure. The conductive metal is present in an amount sufficient to render the composite matrix conductive. In general, the matrix becomes conductive when the metal particles start to touch. A 100% glass material is nonconductive and 100% metal is conductive. For composites between 100% glass and x % glass/y % metal, the metal content is insufficient to render the composite conductive, but for composites between x % glass/y % metal and 100% metal, the metal content is sufficient for the metal particles to touch each other, thereby rendering the composite conductive.

The amount of metal sufficient to render the composite matrix conductive will vary depending mainly on the metal particle morphology. For example, y % will generally need to be higher for spherical powder metal than for metal flakes. The metal portion of the composite material advantageously comprises between about 60% and about 98% of the composite, and more advantageously about 88–98%. If the glass content is less than about 2%, the content may be insufficient to establish the sintered bond that adheres the composite to the ceramic dielectric layer 32, and to control the sintering of the composite such that it more closely relates to the sintering of the ceramic dielectric layer 32. Where the glass content is concentrated near the interface with the ceramic dielectric layer 32, low glass content may be used to establish the sintered bond, for example 2–6%. Where the glass frit is dispersed throughout the conductive blocks 38, 40, a higher content of glass may be desired to ensure a strong bond with the ceramic dielectric layer 32, for example 6–12%. Thus, it may be appreciated that the glass content need not be homogeneous throughout the conductive blocks 38, 40 so long as the conductive blocks 38, 40 are conductive throughout and sufficient glass resides adjacent the interface with the ceramic dielectric layer 32 to fuse with the ceramic particles and form a sufficiently strong bond region that will not be greatly susceptible to bond detachment.

The conductive metal may be Ag, $AgNO_3$ or $AgCO_3$, for example. Alternatively, Cu and Ni and alloys thereof may be used, but these metal systems will generally require a reducing atmosphere. Pd, Pt, Au and alloys thereof may also be used, but these metal systems are generally more expensive than Ag-based systems. The glass may be any desired glass composition, advantageously having a softening point between about 600–1000° C. Advantageously, the ceramic material for dielectric layer 32 is an ultra-low firing ceramic, for example, one that fires around 900° C. An exemplary ceramic is a BaTiO$_3$ based ceramic. The metals generally used for the conductive metal portion of the composite generally sinter around 800° C., such that the ultra-low firing ceramic material and glass are compatible with each other and with the metal portion. Regardless, the ceramic material and glass must sinter below the melting point of the metal.

An advantage of the capacitors 30 of the present invention is that the ceramic dielectric layer 32 may be made very thin between the structurally supportive conductive blocks 38, 40, thereby providing high capacitance for a small chip size that is easily manufactured and mounted on the pc board 10. FIG. 3B depicts exemplary dimensions for a capacitor 30, with x referring to the horizontal width, y referring to the vertical height, and z referring to the depth, relative to a pc board (not shown). The dimensions for conductive block 38 may be expressed as $(x_1) \times (y) \times (z)$, and the dimensions for conductive block 40 may be expressed as $(x_2) \times (y) \times (z)$. The dimensions of the ceramic dielectric layer 32 may be expressed as $(x_3) \times (z)$. The dimensions for the overall capacitor 30 may be expressed as $(x) \times (y) \times (z)$, wherein $x=x_1+x_2+x_3$. To provide the structural support that allows ceramic dielectric layer 32 to be made very thin, the conductive blocks 38, 40 advantageously have a horizontal width $x_1$, $x_2$ (thickness) at least two times the horizontal width $x_3$ (thickness) of the ceramic dielectric layer 32. The ceramic dielectric layer 32 is advantageously 10 mils wide or less, such that $x_3 \leq 10$, and more advantageously 1–5 mils.

By way of example, for square conductive end blocks 38, 40, an exemplary capacitor 30 may have conductive blocks 38, 40 of 10×10×10 mils and a ceramic dielectric layer 32 of 5×10×10 mils, for a total capacitor 30 dimension of 25×10×10 mils. Thus, where $x_1$ and $x_2$ are each 10 mils, the capacitor 30 may have dimensions in the range of 21×10×10 mils to 25×10×10 mils. Alternatively, conductive blocks 38, 40 may be rectangular rather than square, for example y may be half the value of $x_1$, $x_2$ and z, such that 10 mils wide end blocks 38, 40 may provide capacitors 30 having dimensions in the range of 21×5×10 mils to 25×5×10 mils. For 20 mils square conductive blocks 38, 40, ceramic dielectric layer 32 has a width $x_3$ of 10 mils or less, and advantageously less than 7 mils. A capacitor 30 with 20 mils square conductive blocks 38, 40 may have overall dimensions in the range of 41×20×20 mils to 50×20×20 mils, and advantageously 41×20×20 mils to 47×20×20 mils. By way of further example, if the height y of the conductive blocks 38, 40 is cut in half, the capacitor 30 would have overall dimensions in the range of 41×10×20 mils to 50×10×20 mils, and advantageously 41×10×20 mils to 47×10×20 mils.

Referring to the example in the Background, the 20 mils square part (A) of 5 mils thickness (d) made from ceramic with a relative dielectric constant of 100 yielded a capacitance of 8 picofarads, but did not have structural strength and was subject to undesirable fracturing or chipping during handling and assembly. The capacitors 30 of the present invention having 20 mils square $((y) \times (z))$ conductive blocks 38, 40 with a 5 mils dielectric thickness $(x_3)$ and a ceramic dielectric constant of 100 also yields a capacitance of 8 picofarads, but the capacitor 30 exhibits high structural strength without the undesirable fracturing or chipping. By varying the ceramic dielectric thickness or width $x_3$ between 1 and 10 mils, the capacitance may be varied between 4 and 40 picofarads, and advantageously between 8 and 40 picofarads for the 1–5 mils ceramic dielectric width $x_3$.

By way of further example, 30 mils square conductive blocks 38, 40 may be used, with a ceramic dielectric layer 32 thickness $x_3$ less than 15, and advantageously less than 10 mils. A capacitor 30 with 30 mils square conductive blocks 38, 40 will have overall dimensions in the range of 61×30×30 mils to 75×30×30 mils, and advantageously in the range of 61×30×30 mils to 70×30×30 mils. For a capacitor 30 having rectangular conductive blocks 38, 40 wherein the height y is cut in half, the overall dimensions will be in the range of 61×15×30 mils to 75×15×30 mils, and advantageously 61×15×30 mils to 70×15×30 mils. The capacitance for a capacitor 30 having the 30 mils square conductive blocks 38, 40 will thus be in the range of 6–90 picofarads, and advantageously 9–90 picofarads when the ceramic dielectric layer 32 is 1–10 mils thick, assuming a dielectric constant of 100. In the example above for 10 mils square conductive blocks 38, 40, the capacitance may vary between 2–10 picofarads. Thus, capacitors 30 of the present invention have improved structural strength over prior art standing capacitors at the same or higher capacitance.

FIG. 4A provides an alternative embodiment in which a capacitor 46 of the present invention includes conductive blocks 48, 50 that comprise a glass/metal composite portion 52 adjacent each of opposing vertical surfaces 32a, 32b of the ceramic dielectric layer 32 and a metal portion 54 adjacent each of opposing surfaces 52a, 52b of the composite portions 52. The glass in the composite portions 52 sinters with the ceramic dielectric layer 32 and the metal in the composite portions 52 forms a metallurgical bond with the metal in the metal portions 54 to create a monolithic structure with essentially no distinct boundaries, but rather, bond regions as depicted by phantom lines in FIG. 4A and in perspective view in FIG. 4B. Capacitor 46 is considered monolithic due to the absence of preformed parts that require epoxy, glue, solder or other attachment means between layers. As with capacitor 30, capacitor 46 has four-way symmetry such that it may be mounted on a pc board without regard for orientation.

Figure 4B:
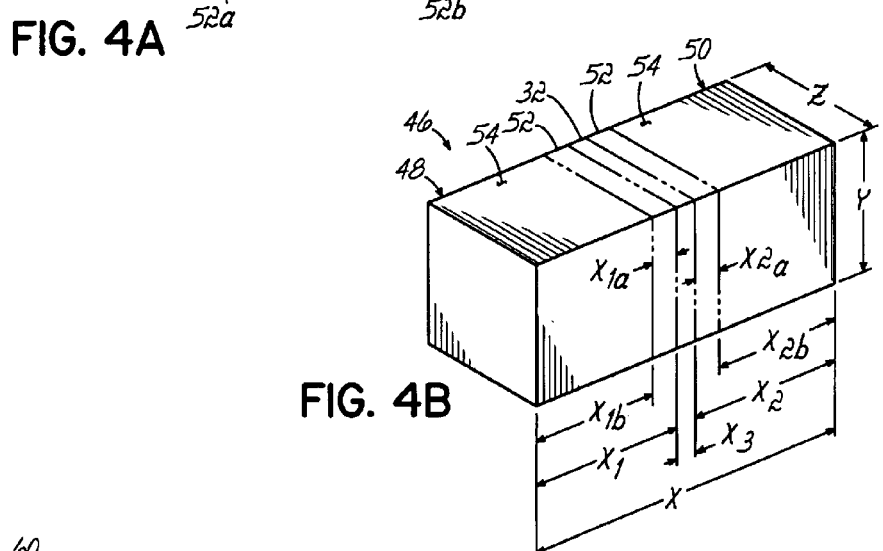
FIG. 4B is a perspective view of the capacitor of FIG. 4A.

FIG. 4B further depicts the dimensions for the capacitor 46. The dimensions $x_1$, $x_2$, $x_3$, x, y and z are as described above with reference to capacitor 30 depicted in FIG. 3B. However, in capacitor 46, conductive blocks 48, 50 each include a composite portion 52 of width $x_{1a}$, $x_{2a}$, respectively, and a metal portion 54 of width $x_{1b}$, $x_{2b}$, respectively. Thus, $x_1=x_{1a}+x_{1b}$ and $x_2=x_{2a}+x_{2b}$. By way of example, the width $x_{1a}$, $x_{2a}$ of the composite portions 52 may be in the range of 0.1 mil to 5 mil. Thus, for 10×10×10 mils conductive blocks 48, 50, composite portions 52 may have dimensions of 0.1–5×10×10 mils, and metal portions 54 may have dimensions of 5–9.9×10×10 mils. The width $x_{1a}$, $x_{2a}$ of the composite portions 52 maybe varied as desired, with a corresponding variation in the width $x_{1b}$, $x_{2b}$ of the metal portions 54 to provide the desired width $x_1$, $x_2$ for the conductive blocks 48, 50. Thus, capacitor 46 provides an example in which the glass content of the conductive blocks is not homogeneous throughout, but rather, is concentrated adjacent the interface with the ceramic dielectric layer 32.

Figure 5:
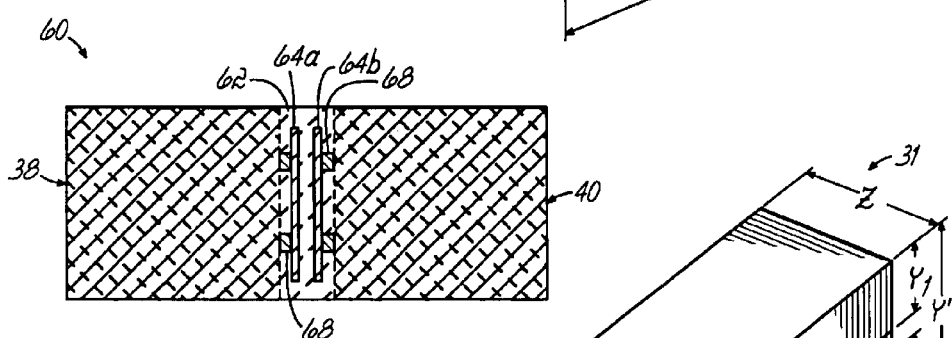
FIG. 5 is a cross-sectional view of an alternative embodiment of the capacitor of FIG. 3A having buried internal electrodes.

Another alternative embodiment is provided in FIG. 5, wherein capacitor 60, which is similar to capacitor 30, is provided with a ceramic dielectric layer 62 that includes buried electrodes. Specifically, a pair of internal metal electrodes 64a, 64b are provided within the ceramic dielectric layer 62, and connected to respective conductive composite blocks 38, 40 by a plurality of vias 68. Any number of vias 68 may be used providing that at least one via 68 connects each buried electrode 64a, 64b to a respective conductive composite block 38, 40. Advantageously, the buried electrodes 64a, 64b and vias 68 comprise the same metal as the conductive blocks 38, 40. Use of the buried electrodes and vias enables variation of the capacitance of capacitor 60. Although not shown, buried electrodes may also be provided in capacitor 46.

Figure 6:
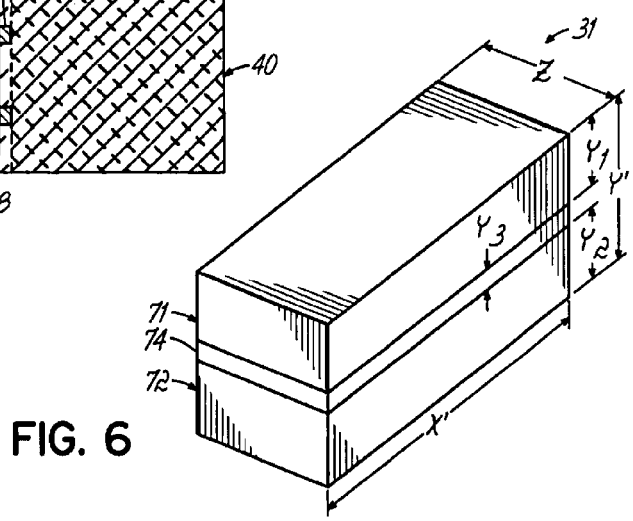
FIG. 6 is a perspective view of a hybrid flat capacitor having top and bottom conductive composite blocks in accordance with the present invention.

If desired, the same basic constructions used for capacitors 30, 46 and 60 may be used with different aspect ratios to create a horizontally-oriented hybrid flat capacitor 31, as shown in perspective view in FIG. 6. FIG. 6 depicts a horizontally-disposed ceramic dielectric layer 74 between top and bottom conductive composite blocks 71, 72 containing glass and a conductive metal, wherein bottom conductive block 72 is mounted on the pc board 10 (not shown) and the top conductive block 71 is connected by wire bonding (not shown). As in previously described embodiments, the conductive composite blocks 71, 72 function as electrodes for the hybrid capacitor 31. Hybrid refers to the fact that the two electrodes 71, 72 of the capacitor 31 are electrically connected to the pc board by two different methods. While the horizontally-oriented capacitor 31 requires wire bonding of the top electrode 71, the capacitor 31 still has two-way symmetry, allowing for its placement on the pc board 10 with less regard for orientation, thereby representing an advantage over prior art wire-bonded capacitors. Moreover, due to the presence of the conductive composite blocks 71, 72, the ceramic dielectric layer 74 may be made thinner without sacrificing the structural integrity of the capacitor 31.

FIG. 6 further depicts the dimensions for the horizontally-oriented hybrid flat capacitor 31. The overall dimensions x', y', z for capacitor 31 may be the same as the overall dimensions x, y, z of capacitor 30, but the aspect ratios for the conductive blocks 71, 72 differ from that of conductive blocks 38, 40 of capacitor 30. By way of example, for a 50×20×20 mils capacitor 31, the conductive blocks 71, 72 have a width x' of 50 mils and a depth z of 20 mils. The height $y_1$, $y_2$ of conductive blocks 71, 72, respectively, are each at least twice the thickness or height $y_3$ of ceramic dielectric layer 74. Thus, if y' is 20 mils, then the thickness or height $y_3$ of the ceramic dielectric layer 74 may be 1–4 mils and the corresponding thicknesses or heights $y_1$, $y_2$ of the conductive blocks 71, 72 maybe 8–9.5 mils. If y' is 30 mils, the thickness or height $y_3$ of ceramic dielectric layer 74 maybe 1–6 mils and the corresponding thicknesses or heights $y_1$, $y_2$ of conductive blocks 71, 72 may be 12–14.5 mils. If y' is 10 mils, then the thickness or height $y_3$ of the ceramic dielectric layer 74 may be 1–2 mils, and the corresponding thicknesses or heights $y_1$, $y_2$ of the conductive blocks 71, 72 maybe 4–4.5 mils. The width x' may be any value from 20–75 mils, for example.

While exemplary dimensions have been provided for capacitors 30, 31 and 46, persons skilled in the art may appreciate that these dimensions may be varied provided that the ceramic dielectric thickness, either width or height (i.e., the distance between the conductive blocks) is 15 mils or less, and advantageously 10 mils or less, and the corresponding thickness dimension (width or height) of the conductive blocks is at least twice the ceramic dielectric thickness to provide sufficient structural support to the thin ceramic dielectric layer. It is theoretically possible to utilize ceramic dielectric layers thinner than 1 mil from a structural standpoint, but if the ceramic dielectric layer is too thin, the capacitor will be more susceptible to shorting the circuit.

Figure 7:
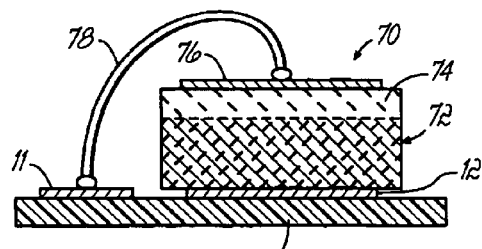
FIG. 7 is a cross-sectional view of an alternative embodiment of a hybrid flat capacitor of the present invention having a bottom conductive composite block and a top metallization, and further depicting the hybrid capacitor mounted to the pc board.

While FIG. 6 depicts in perspective view a horizontally-disposed ceramic dielectric layer 74 between top and bottom conductive composite blocks 71, 72, it may be appreciated that the top conductive block 71 may be eliminated and replaced with a metallization, for example as shown in FIG. 7. FIG. 7 depicts a horizontally-disposed hybrid capacitor 70 with a single conductive composite block 72 mounted directly on surface trace 12 on the pc board 10. Conductive composite block 72 functions as an electrode. The ceramic dielectric layer 74 is oriented horizontally with respect to the pc board 10 and is disposed on top of the conductive block 72, which provides structural integrity to the capacitor 70. Advantageously, the thickness (height) of the conductive composite block 72 is at least two times the thickness of the ceramic dielectric layer 74 to provide that structural support. Ceramic dielectric layer 74 has a top metallization 76 thereon to function as a second electrode. A metal lead 78 electrically connects top metallization 76 to surface trace 11 on the pc board 10.

Figure 8:
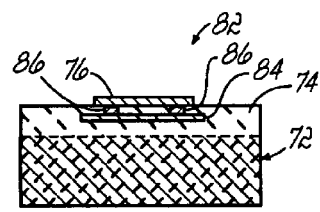
FIG. 8 is a cross-sectional view of an alternative embodiment of the capacitor of FIG. 7 having a buried internal electrode.

Capacitor 82 in FIG. 8 is similar to capacitor 70 in FIG. 7, but further includes a buried or internal metal electrode 84 within the ceramic dielectric layer 74, electrically connected to the top metallization 76 by a plurality of vias 86. In the hybrid capacitor embodiments of FIGS. 6–8, while wire bonding is still required to make the electrical connection to the top metallization 76, the composite block 72 provides structural support thereby enabling a thinner ceramic dielectric layer 74 and thus a high capacitance.

Thus, in any capacitor of the present invention, whether the ceramic dielectric is vertically or horizontally oriented, the thickness of the dielectric is measured in a direction perpendicular to the bond region(s), which is (are) formed by co-sintering the ceramic dielectric to the conductive composite block(s), and the thickness(es) of the conductive composite block(s) are measured from the bond region with the ceramic dielectric in a corresponding direction, i.e., perpendicular to the bond region. The bond region may also be referred to by reference to interfaces, internal faces or surfaces, but it may be understood that these faces/surfaces are blurred, in effect, by the co-sintering of the green materials, as discussed further below. As thus defined, the thickness of the conductive composite block(s) is advantageously at least two times the thickness of the ceramic dielectric to provide sufficient structural support to the thin ceramic dielectric layer.

Figure 9:
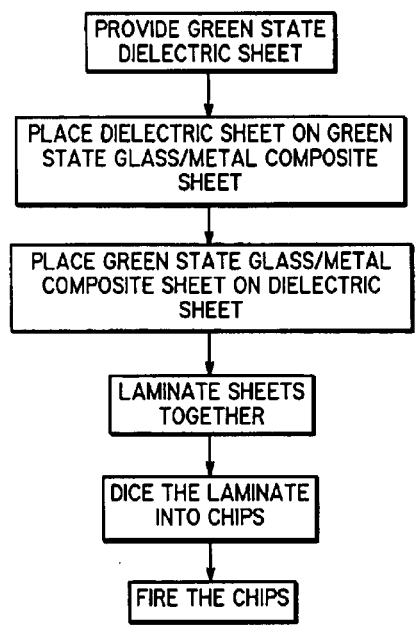
FIG. 9 is a flow chart setting forth an exemplary method in accordance with the present invention for fabricating the capacitor of FIGS. 3A–3B.
Figure 10:
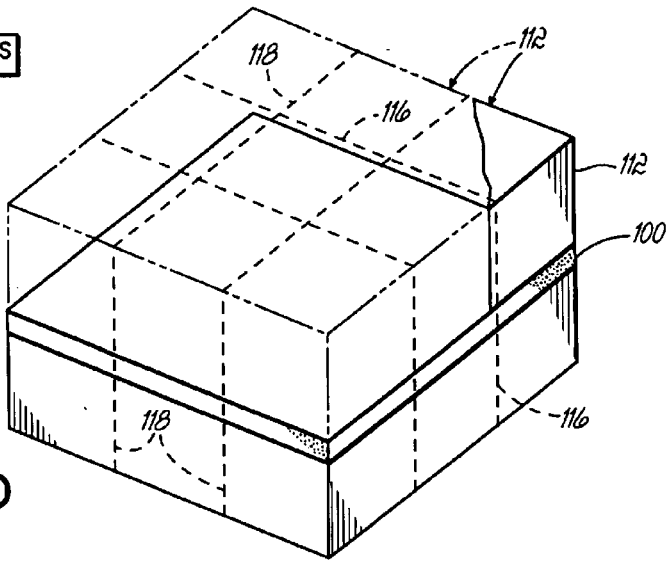
FIG. 10 is a perspective view of an assembled array for forming a plurality of the capacitors of FIGS. 3A–3B in accordance with the exemplary method set forth in FIG. 9.

The method of the present invention further provides an accurate, easy and inexpensive means for assembling a capacitor of the present invention. The method begins with all portions of the capacitor in the green state, i.e., the unfired state. One exemplary embodiment of the method of the present invention may be further understood with reference to the flowchart of FIG. 9 and the perspective view of FIG. 10, which depicts the assembly of green sheets of material from which a plurality of capacitors may be formed by dicing and firing the sheets.

The exemplary method is described with reference to the manufacture of capacitor 30 of FIGS. 3A and 3B. A green-state (unfired) ceramic sheet or tape 100 is provided to form the ceramic dielectric layer 32. By way of example and not limitation, the ceramic tape 100 may be on the order of 1–15 mils thick, and advantageously about 1–10 mils thick, and more advantageously about 1–5 mils thick. The ceramic dielectric sheet 100 is placed upon a green-state (unfired) glass/metal composite sheet 110 such that the dimensions of the composite sheet 110 are substantially equal in length and width to the corresponding dimensions of the ceramic sheet 100, and the two sheets are substantially aligned. A second green-state (unfired) glass/metal composite sheet 112 is then placed on the ceramic dielectric sheet 100, and again, the composite sheet 112 has dimensions substantially equal to the ceramic sheet 100 and the sheets are aligned. Composite sheets 110 and 112 will form the conductive composite blocks 38, 40 of capacitor 30, and contain sufficient metal content to render the composite conductive. By way of example and not limitation, the composite sheets 110, 112 may have a thickness on the order of 10–30 mils. By way of further example and not limitation, using 5×5×0.02 inch composite sheets, 40,000 capacitors having 20×20 mils square conductive composite blocks may be fabricated.

The composite sheets 110, 112 with the ceramic dielectric sheet 100 therebetween are then laminated together, such as by isostatic pressing. In one embodiment of the method of the present invention, the laminate is then diced into individual chips, by first cutting along cut lines 116, and then cutting non-parallel, and advantageously crosswise, along cut lines 118, or vice versa. The cut lines 116, 118 may be adjusted, for example, to form square or rectangular dimensions. For example, the cut lines 116, 118 may be adjusted such that each composite sheet 110, 112 is cut to form 10×10 mils blocks, 20×20 mils blocks, or 30×30 mils blocks. The individual chips formed by dicing are then fired to sinter the glass and ceramic materials together. After sintering, the composite top sheet 112 forms end block 38 and composite bottom sheet 110 forms end block 40 and the ceramic from the dielectric sheet fuses together with the glass in the composite sheets 110, 112 to create a fused structure from one layer to another, essentially eliminating the boundaries therebetween and instead forming bond regions, as shown in phantom in FIG. 3B to form a monolithic structure. Because the end blocks 38, 40 are conductive, the end blocks serve as the electrodes and provide the connection to metal surface traces 11, 12 on a pc board 10. In another embodiment of the method of the present invention, the laminate is fired first before dicing into individual chips. The result is the same, but the means for dicing the laminate will differ depending on whether it is diced, then fired or fired, then diced. For example, a razor blade or similar means may be used for dicing the green state laminate, while a diamond saw may be used for dicing the fired laminate.

Figure 11:
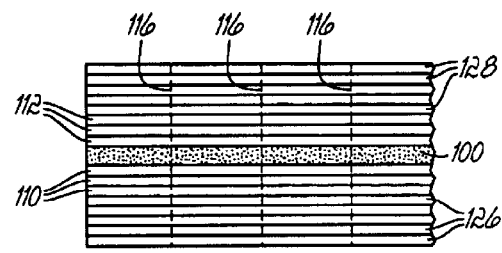
FIG. 11 is a partial view of an alternative array for forming a plurality of the capacitors of FIGS. 4A–4B in accordance with the exemplary method set forth in FIG. 9.

In another embodiment of the method of the invention for forming the capacitor 46 of FIGS. 4A and 4B, the method further depicted in side view in FIG. 11, the ceramic sheet 100 is placed between a plurality of composite sheets 110 and a plurality of composite sheets 112, which sheets 110, 112 are thin cast tape layers placed one on top of another. A plurality of metal layers or sheets 126, 128 are placed on either side of the composite sheets 110, 112, respectively. The layers 110, 112 adjacent the ceramic sheet 100 are glass/metal composites with sufficient glass content to fuse with the ceramic sheet 100 during the sintering step to form composite portions 52 of conductive blocks 48, 50. The metal content of the composite is sufficient to be conductive, and the metal bonds with the metal layers 126, 128, which form the metal portions 54. Thus, the conductive blocks 48, 50 need not have a homogeneous composition throughout, but need only have sufficient non-metal content adjacent the interface with the ceramic dielectric layer 32 to fuse together with layer 32 to form a monolithic structure. To state another way, there need only be sufficient non-metal content adjacent the ceramic dielectric layer 32 to create a strong bond region. In addition, one sheet or a plurality of thin sheets may be used to form the conductive composite blocks or to form the dielectric, as desired. For example, one 5 mils thick ceramic sheet may be used to form a 5 mils thick ceramic dielectric, or two such sheets may be used to form a 10 mils thick ceramic dielectric.

Variations on the above-described methods may be made, as understood by one skilled in the art, to fabricate the alternative embodiments described herein. For example, for the embodiments of FIGS. 7 and 8, one of the steps in the method of FIG. 9 of placing a green-state composite sheet on the ceramic dielectric sheet may be eliminated because only one composite block 72 is to be formed. Additionally, the metallization 76 may be printed on the chip after or before firing the chips. In yet another example, the ceramic dielectric sheet may be provided with buried electrodes and metal filled vias in accordance with the same or similar techniques as that set forth in commonly-owned, U.S. Pat. No. 6,542,352 entitled CERAMIC CHIP CAPACITOR OF CONVENTIONAL VOLUME AND EXTERNAL FORM HAVING INCREASED CAPACITANCE FROM USE OF CLOSELY SPACED INTERIOR CONDUCTIVE PLANES RELIABLY CONNECTING TO POSITIONALLY TOLERANT EXTERIOR PADS THROUGH MULTIPLE REDUNDANT VIAS issued Apr. 1, 2003, and incorporated by reference herein in its entirety.

With reference to FIGS. 3A, there is further provided a method of making a printed circuit board, in which a capacitor 30 of the present invention is bonded to the surface traces 11, 12 on a pc board 10. An external face of conductive composite end block 38 is bonded directly to surface trace 11 and an external face of conductive composite end block 40 is bonded directly to surface trace 12. The bonded external faces are substantially perpendicular to the opposing vertical surfaces 32a, 32b such that the ceramic dielectric layer 32 is oriented vertically with respect to the printed circuit board 10. Advantageously, the thickness of the conductive composite end blocks 38, 40 is at least twice the thickness of the ceramic dielectric layer, as measured in a direction parallel to the surface of the printed circuit board 10.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative product and method and illustrative examples shown and described. Accordingly, departures may be made from such details without departing from the scope or spirit of the general inventive concept.

What is claimed is:

1. A capacitor comprising an essentially monolithic structure of a ceramic dielectric and at least a first conductive block having at least a composite portion consisting essentially of glass and a conductive metal in an amount sufficient to render the composite portion conductive, wherein the composite portion is adjacent the ceramic dielectric and the glass of the composite portion is co-sintered to the ceramic dielectric such that there is a bond region but essentially no boundary between the composite portion and the ceramic dielectric, and wherein the first conductive block serves as a first electrode for the capacitor and is directly mountable on a first metallic surface trace on a printed circuit board.

2. The capacitor of claim 1 wherein the conductive metal comprises about 60–98% of the composite portion and the glass comprises about 2–40% of the composite portion.

3. The capacitor of claim 1 wherein the conductive metal comprises about 88–98% of the composite portion and the glass comprises about 2–12% of the composite portion.

4. The capacitor of claim 1 further comprising an internal metal electrode within the ceramic dielectric and at least one conductive metal-filled via extending from the internal metal electrode to the composite portion.

5. The capacitor of claim 1 wherein the first conductive block consists entirely of the composite portion.

6. The capacitor of claim 5 wherein the glass is distributed homogeneously throughout a matrix of the conductive metal.

7. The capacitor of claim 5 wherein the glass is concentrated in the first conductive block adjacent the ceramic dielectric.

8. The capacitor of claim 1 wherein the first conductive block includes a metal portion adjacent the composite portion and opposite the ceramic dielectric.

9. The capacitor of claim 1 further comprising a second conductive block having at least a composite portion adjacent and sintered to the ceramic dielectric opposite the first conductive block, wherein the second conductive block serves as a second electrode for the capacitor and is directly mountable on a second metallic surface trace on a printed circuit board.

10. The capacitor of claim 9 wherein the first and second conductive blocks each consist entirely of the composite portions.

11. The capacitor of claim 10 wherein the glass is distributed in the first and second conductive blocks homogeneously throughout a matrix of the conductive metal.

12. The capacitor of claim 10 wherein the glass is concentrated in the first and second conductive blocks adjacent the ceramic dielectric.

13. The capacitor of claim 9 wherein the first and second conductive blocks each include a metal portion adjacent the composite portion and opposite the ceramic dielectric.

14. The capacitor of claim 1 wherein the ceramic dielectric is horizontally disposed with the composite portion of the first conductive block sintered to a bottom portion thereof, and the capacitor further comprising a metallization on a top portion of the ceramic dielectric, the metallization adapted to be wire bonded to a second metallic surface trace on a printed circuit board.

15. The capacitor of claim 1 wherein the ceramic dielectric is horizontally disposed with the composite portion of the first conductive block sintered to a bottom portion thereof, and the capacitor further comprising a second conductive block having at least a composite portion adjacent and sintered to the ceramic dielectric opposite the first conductive block, wherein the second conductive block serves as a second electrode for the capacitor and is adapted to be wire bonded to a second metallic surface trace on a printed circuit board.

16. The capacitor of claim 1 wherein the ceramic dielectric is free of internal metal electrodes.

17. The capacitor of claim 1 wherein the first conductive block and the ceramic dielectric each have a thickness in a direction perpendicular from the bond region, and the thickness of the first conductive block is at least two times the thickness of the ceramic dielectric.

18. The capacitor of claim 17 wherein the thickness of the ceramic dielectric is about 10 mils or less.

19. The capacitor of claim 17 wherein the thickness of the ceramic dielectric is about 1–5 mils.

20. A printed circuit board comprising a metallic surface trace having a mounting surface oriented horizontally with respect to the board, and the capacitor of claim 1 mounted thereon with one of the external faces of the first conductive block bonded to the mounting surface of the metallic surface trace, wherein the bond region between the composite portion and the ceramic dielectric is oriented vertically with respect to the board.

21. A printed circuit board comprising a metallic surface trace having a mounting surface oriented horizontally with respect to the board, and the capacitor of claim 1 mounted thereon with one of the external faces of the first conductive block bonded to the mounting surface of the metallic surface trace, wherein the bond region between the composite portion and the ceramic dielectric is oriented horizontally with respect to the board.

22. A surface mountable, monolithic capacitor comprising:
a center ceramic dielectric having first and second opposed surfaces;
first and second conductive composite end blocks each consisting essentially of glass and a conductive metal in an amount sufficient to render the composite conductive, the first and second conductive composite end blocks each having an internal face and a plurality of external faces,
wherein the glass at the internal face of the first conductive composite end block is co-sintered to the first opposed surface of the center ceramic dielectric so as to have essentially no boundary therebetween, and
wherein the glass at the internal face of the second conductive composite end block is co-sintered to the second opposed surface of the center ceramic dielectric so as to have essentially no boundary therebetween,
whereby the first and second conductive composite end blocks serve as first and second electrodes for the capacitor.

23. The capacitor of claim 22 wherein the conductive metal comprises about 60–98% and the glass comprises about 2–40% of the first and second conductive composite end blocks.

24. The capacitor of claim 22 wherein the conductive metal comprises about 88–98% and the glass comprises about 2–12% of the first and second conductive composite end blocks.

25. The capacitor of claim 22 further comprising a first internal metal electrode within the center ceramic dielectric and at least one first conductive metal-filled via extending from the first internal metal electrode to the first conductive composite end block.

26. The capacitor of claim 25 further comprising a second internal metal electrode within the center ceramic dielectric and at least one second conductive metal-filled via extending from the second internal metal electrode to the second conductive composite end block.

27. The capacitor of claim 22 wherein the glass in the first and second conductive composite end blocks is distributed homogeneously throughout a matrix of the conductive metal.

28. The capacitor of claim 22 wherein the glass in the first and second conductive composite end blocks is concentrated adjacent the internal faces of the first and second conductive composite end blocks.

29. The capacitor of claim 22 wherein the first and second conductive composite end blocks each include a composite portion consisting essentially of the glass and the conductive metal positioned adjacent the respective internal faces and co-sintered to the respective first and second opposed surfaces of the center ceramic dielectric and a metal portion consisting essentially of the conductive metal positioned adjacent the respective composite portion opposite the center ceramic dielectric.

30. The capacitor of claim 22 wherein the center ceramic dielectric is free of internal metal electrodes.

31. The capacitor of claim 22 wherein the center ceramic dielectric has a thickness in a direction from the first opposed surface to the second opposed surface, and the first and second conductive composite end blocks each have a thickness in a corresponding direction, and wherein the thicknesses of the first and second conductive composite end blocks are each at least two times the thickness of the center ceramic dielectric.

32. The capacitor of claim 31 wherein the thickness of the ceramic dielectric is about 10 mils or less.

33. The capacitor of claim 31 wherein the thickness of the ceramic dielectric is about 1–5 mils.

34. The capacitor of claim 22 wherein the first and second conductive composite end blocks are square blocks each having width×height×depth dimensions of about 10 mils×10 mils×10 mils, and wherein the center ceramic dielectric has width×height×depth dimensions of about 1–5 mils×10 mils× 10 mils.

35. The capacitor of claim 22 wherein the first and second conductive composite end blocks are square blocks each having width×height×depth dimensions of about 20 mils×20 mils×20 mils, and wherein the center ceramic dielectric has width×height×depth dimensions of about 1–10 mils×20 mils×20 mils.

36. The capacitor of claim 22 wherein the first and second conductive composite end blocks are square blocks each having width×height×depth dimensions of about 20 mils×20 mils×20 mils, and wherein the center ceramic dielectric has width×height×depth dimensions of about 1–7 mils×20 mils× 20 mils.

37. The capacitor of claim 22 wherein the first and second conductive composite end blocks are square blocks each having width×height×depth dimensions of about 30 mils×30 mils×30 mils, and wherein the center ceramic dielectric has width×height×depth dimensions of about 1–15 mils×30 mils×30 mils.

38. The capacitor of claim 22 wherein the first and second conductive composite end blocks are square blocks each having width×height×depth dimensions of about 30 mils×30 mils×30 mils, and wherein the center ceramic dielectric has width×height×depth dimensions of about 1–10 mils×30 mils×30 mils.

39. A printed circuit board comprising first and second metallic surface traces, each with a mounting surface oriented horizontally with respect to the board, and the capacitor of claim 22 mounted thereon with one of the external faces of each of the first and second conductive composite end blocks bonded to the respective mounting surface of the first and second metallic surface traces and the opposed surfaces of the ceramic dielectric and the internal faces of the first and second conductive composite end blocks oriented vertically with respect to the board.

40. A printed circuit board comprising first and second metallic surface traces, each with a mounting surface oriented horizontally with respect to the board, and the capacitor of claim 22 mounted thereon with one of the external faces of the first conductive composite end block bonded directly to the mounting surface of the first metallic surface traces and the opposed surfaces of the ceramic dielectric and the internal faces of the first and second conductive composite end blocks oriented horizontally with respect to the board, and a conductive wire bonded at a first end to the second metallic surface trace and at a second end to one of the external faces of the second conductive composite end block.

41. A printed circuit board comprising:
first and second metallic surface traces, each having a generally horizontally oriented mounting surface; and
a capacitor chip comprising a vertically oriented center ceramic dielectric between first and second conductive composite end blocks, the first and second conductive composite end blocks each consisting essentially of glass and a conductive metal in an amount sufficient to render the composite conductive, and each having a plurality of external faces and an internal vertical face oriented vertically relative to the mounting surfaces of the first and second metallic surface traces, wherein the glass at the internal vertical face of each of the first and second conductive composite end blocks is co-sintered to respective opposed vertically oriented surfaces of the center ceramic dielectric so as to have essentially no boundary therebetween,
wherein the first conductive composite end block is directly mounted to the mounting surface of the first metallic surface trace and the second conductive composite end block is directly mounted to the mounting surface of the second metallic surface trace, and wherein the first and second conductive composite end blocks serve as first and second electrodes for the capacitor.

42. The printed circuit board of claim 41 wherein the glass in the first and second conductive composite end blocks is concentrated adjacent the internal faces of the first and second conductive composite end blocks.

43. The printed circuit board of claim 41 wherein the first and second conductive composite end blocks each include a composite portion consisting essentially of the glass and the conductive metal positioned adjacent the respective internal faces and co-sintered to the respective first and second opposed surfaces of the center ceramic dielectric and a metal portion consisting essentially of the conductive metal positioned adjacent the respective composite portion opposite the center ceramic dielectric.

44. The printed circuit board of claim 41 wherein the center ceramic dielectric has a thickness in a direction from the first opposed surface to the second opposed surface, and the first and second conductive composite end blocks each have a thickness in a corresponding direction, and wherein the thicknesses of the first and second conductive composite end blocks are each at least two times the thickness of the center ceramic dielectric.

45. The printed circuit board of claim 44 wherein the thickness of the ceramic dielectric is about 10 mils or less.

46. The printed circuit board of claim 44 wherein the thickness of the ceramic dielectric is about 1–5 mils.

47. The printed circuit board of claim 41 wherein the first and second conductive composite end blocks are square blocks each having width×height×depth dimensions of about 10 mils×10 mils×10 mils, and wherein the center ceramic dielectric has width×height×depth dimensions of about 1–5 mils×10 mils×10 mils.

48. The c printed circuit board of claim 41 wherein the first and second conductive composite end blocks are square blocks each having width×height×depth dimensions of about 20 mils×20 mils×20 mils, and wherein the center ceramic dielectric has width×height×depth dimensions of about 1–10 mils×20 mils×20 mils.

49. The printed circuit board of claim 41 wherein the first and second conductive composite end blocks are square blocks each having width×height×depth dimensions of about 20 mils×20 mils×20 mils, and wherein the center ceramic dielectric has width×height×depth dimensions of about 1–7 mils×20 mils×20 mils.

50. The printed circuit board of claim 41 wherein the first and second conductive composite end blocks are square blocks each having width×height×depth dimensions of about 30 mils×30 mils×30 mils, and wherein the center ceramic dielectric has width×height×depth dimensions of about 1–15 mils×30 mils×30 mils.

51. The printed circuit board of claim 41 wherein the first and second conductive composite end blocks are square blocks each having width×height×depth dimensions of about 30 mils×30 mils×30 mils, and wherein the center ceramic dielectric has width×height×depth dimensions of about 1–10 mils×30 mils×30 mils.

* * * * *